(12) United States Patent
Mizuno

(10) Patent No.: US 7,619,489 B2
(45) Date of Patent: Nov. 17, 2009

(54) SEMICONDUCTOR INTEGRATED CIRCUIT

(75) Inventor: Masayuki Mizuno, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/687,921

(22) Filed: Mar. 19, 2007

(65) Prior Publication Data

US 2007/0152307 A1 Jul. 5, 2007

Related U.S. Application Data

(62) Division of application No. 09/664,094, filed on Sep. 19, 2000, now abandoned.

(30) Foreign Application Priority Data

Sep. 20, 1999 (JP) ............................... 11-266203

(51) Int. Cl.
*H03H 7/38* (2006.01)
(52) U.S. Cl. ............................. 333/33; 333/1
(58) Field of Classification Search ................. 333/33, 333/238, 246, 204, 1, 4
See application file for complete search history.

(56) References Cited

U.S. PATENT DOCUMENTS

| | | | |
|---|---|---|---|
| 4,399,341 A | 8/1983 | Yasuoka | |
| 4,521,753 A | 6/1985 | Schloemann | |
| 4,851,793 A | 7/1989 | Heckaman et al. | |
| 4,947,178 A | 8/1990 | Shafai | |
| 5,479,138 A | 12/1995 | Kuroda et al. | |
| 5,523,728 A | 6/1996 | McCorkle | |
| 5,568,107 A | 10/1996 | Buuck et al. | |
| 5,634,208 A | 5/1997 | Nishikawa et al. | |
| 5,723,908 A | 3/1998 | Fuchida et al. | |
| 6,023,210 A | 2/2000 | Tulintseff | |
| 6,084,548 A | 7/2000 | Hirabe | |
| 6,225,568 B1 | 5/2001 | Lin et al. | |
| 6,483,714 B1 | 11/2002 | Kabumoto et al. | |

FOREIGN PATENT DOCUMENTS

| | | |
|---|---|---|
| JP | 62-47163 | 3/1987 |
| JP | 5-136597 | 6/1993 |
| JP | 405166965 | 7/1993 |
| JP | 5-267913 | 10/1993 |
| JP | 5-343564 | 12/1993 |
| JP | 5-343820 | 12/1993 |

(Continued)

OTHER PUBLICATIONS

Ittipiboon, P. et al. "Slot-coupled Microstrip Antennas", in Antennas and Propagation Society International Symposium 1990 (May 7-11, 1990), Dallas, TX, USA, pp. 1108-1111 (INSPEC Accession No. 3956834) (IEEE 90CH2776-3/0000-1108).

*Primary Examiner*—Stephen E Jones
(74) *Attorney, Agent, or Firm*—Sughrue Mion, PLLC

(57) ABSTRACT

A semiconductor device comprising a signal transmission line of a microstrip structure, capable of increasing the characteristic impedance of the signal transmission line and reducing coupling between a plurality of signal lines. In a signal transmission line of a microstrip structure composed of a signal line and a ground plate, the capacitance between wires is reduced and the characteristic impedance can be increased by forming holes in the signal line or in the ground plate. The coupling between a plurality of signal lines can also be reduced.

6 Claims, 4 Drawing Sheets

FOREIGN PATENT DOCUMENTS

| | | |
|---|---|---|
| JP | 6-291216 | 10/1994 |
| JP | 8-288463 | 11/1996 |
| JP | 9-36504 | 2/1997 |
| JP | 10-326783 | 12/1998 |
| JP | 11-87512 | 3/1999 |
| JP | 11-177247 | 7/1999 |
| JP | 411251490 | 9/1999 |

SEMICONDUCTOR INTEGRATED CIRCUIT

BACKGROUND OF THE INVENTION

1. Field of the Invention

The present invention relates to a semiconductor integrated circuit, provided with an improved characteristic impedance of the signal transmission line of a semiconductor integrated circuit, capable of reducing coupling with other transmission lines.

2. Background Art

Conventionally, when providing a signal transmission line with a microstrip structure constituted by a signal line and a ground plate in a semiconductor integrated circuit, two separate wiring layers for the signal line and for the ground plate are used as shown in FIG. 8.

In order to increase the characteristic impedance of this signal transmission line in a signal transmission line of a microstrip structure composed of the integrated signal lines and a ground plate, two methods have been adopted, one method is to make the signal line width narrower, and the other method is to increase the distance d between the signal line and the ground plate.

Furthermore, the other conventional technique is disclosed in Japanese Unexamined Patent Application, No. Hei 5-343564, which determines the characteristic impedance of the transmission line by a mesh-like mesh ground plane, and the spaces corresponding to the pores of the mesh are compensated for by the ground plate.

However, when the above-described first method for making the signal line width narrower is adopted, the problem arises that the maximum input capacitance of a circuit connected to the end of the signal transmission line becomes small.

When the above-described second method of increasing the distance d between the signal line and the ground plane is adopted, the problem is encountered that the thickness or the number of wiring layers increases, because it is necessary to increase the thickness of the interlayer films of the wiring layers or to increase the number of wiring layers.

When the third method disclosed in Japanese Unexamined Patent Application, First Publication No. Hei 5-343564 is adopted, although it is possible to increase the impedance of the signal transmission line, the problem arises that, when assembling into an integrated circuit, since the signal lines cannot be formed under the ground plane, it is not possible to avoid generating coupling between a plurality of signal lines.

When coupling occurs, a deficiency arises that in the characteristic impedance of a certain signal line will experience a dynamic change, because the capacitance between one signal line and its counter line changes when the voltage level of the counter signal line changes.

In addition, the problem also arises in the case of using a mesh ground plane that it is difficult to evaluate the characteristic impedance, since the electromagnetic field generated through small holes or spaces cannot be accurately understood.

SUMMARY OF THE INVENTION

This invention has been made to solve the above-described problems. It is, therefore, an objective of the present invention to provide a semiconductor device, capable of reducing the coupling between a plurality of signal lines by increasing the characteristic impedance of the signal transmission line of a microstrip structure, which can be realized in a semiconductor device.

According to the first aspect of the present invention, a semiconductor integrated circuit comprises a signal transmission line of a microstrip structure composed of a signal line and a ground plate, wherein at least one hole is formed in said signal line.*

According to the second aspect, in a semiconductor integrated circuit comprising a signal transmission line of a microstrip structure composed of a signal line and a ground plate, at least one hole is formed in said ground plate.

According to the third aspect, in a semiconductor integrated circuit comprising a signal transmission line of a microstrip structure composed of a signal line and a ground plate according to the second aspect, the size of said at least one hole formed in said ground plate is determined such that the AC coupling between the signal line and another signal line disposed close to one signal line and on the opposite side of said ground plate is decreased and the characteristic impedance of said signal transmission line is increased.

According to the fourth aspect, in a semiconductor integrated circuit comprising a signal transmission line of a microstrip structure composed of a signal line and a ground plate according to the second aspect, the number of said at least one hole formed in said ground plate is determined such that the AC coupling between one signal line and another signal line disposed close to one signal line and on the opposite side of said ground plate is decreased and the characteristic impedance of said signal transmission line is increased.

According to the fifth aspect, in a semiconductor integrated circuit comprising a signal transmission line of a microstrip structure composed of a signal line and a ground plate, at least one hole is formed in both of said signal line and said ground plate.

According to the sixth aspect, in a semiconductor integrated circuit comprising a signal transmission line of a microstrip structure composed of a signal line and a ground plate according to the fifth aspect, the size of said at least one hole formed in said ground plate among the signal line and the ground plate is determined such that the AC coupling between one signal line and another signal line disposed close to one signal line and on the opposite side of said ground plate is decreased and the characteristic impedance of said signal transmission line is increased.

According to the seventh aspect, in a semiconductor integrated circuit comprising a signal transmission line of a microstrip structure composed of a signal line and a ground plate according to the fifth aspect, the number of said at least one hole formed in said ground plate among holes formed in both of the signal line and the ground plate is determined such that the AC coupling between one signal line and another signal line disposed close to one signal line and on the opposite side of said ground plate is decreased and the characteristic impedance of said signal transmission line is increased.

According to the eighth aspect, in a semiconductor integrated circuit comprising a signal transmission line of a microstrip structure composed of a signal line and a ground plate according to the second aspect, said at least one hole in said ground plate is formed at a position where the other signal line is not disposed or said at least one hole in said ground plate is made small so as to reduce the AC coupling with one signal line when formed at a position where the other signal line is disposed.

According to the ninth aspect, in a semiconductor integrated circuit comprising a signal transmission line of a microstrip structure composed of a signal line and a ground plate according to the first aspect, where, instead of at least one hole formed in said signal line or in said ground plate, a plurality of slit holes are formed by forming said signal line or said ground plate of a plurality of thin strips and by connecting these thin strips at those terminal ends.

DETAILED DESCRIPTION OF THE INVENTION

Hereinafter, the present embodiments of the present invention will be described with reference to the drawings.

First Embodiment

Figure 1:
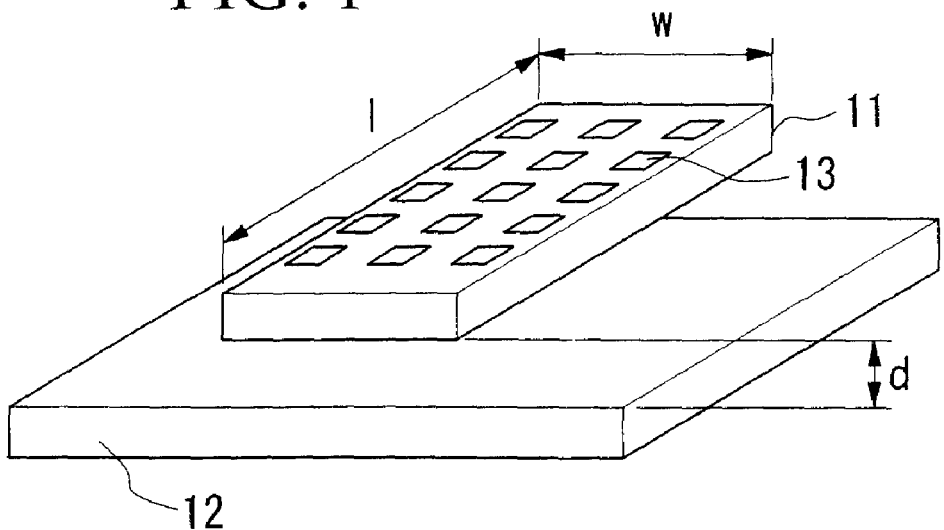
FIG. 1 is a diagram showing the structure of the signal transmission line according to the first embodiment of the present invention.

FIG. 1 is a diagram showing the structure of the signal transmission line according to the first embodiment of the present invention.

As shown in FIG. 1, in the signal transmission line of the microstrip structure realized in a semiconductor device according to the present embodiment, at least one hole 13 (normally, a plurality of holes 13) is formed on a signal line of a microstrip structure composed of a signal line 11 and a ground plate 12. The hole 13 is shown to have an aperture size which is smaller than a width of the signal line 11.

In a signal transmission line of the microstrip structure, the characteristic impedance Z is expressed by the equation, $$Z=(L/C)^{1/2}$$

where C represents the inter-wiring capacitance per unit length, and L represents the inductance of the wiring.

The provision of a hole (or a plurality of holes) in the signal line 11 lengthen the electric force line generated between the signal line 11 and the ground plate 12 and the distance between the signal line 11 and the ground plate 12 is apparently elongated equivalently, which results in a decrease of the inter-wiring capacitance C.

When the velocity of the electro-magnetic wave is represented by v, the velocity v is constant and is expressed by the following equation. $v=1/(LC)1^{1/2}$ Thus, when the capacitance C decreases, the wiring inductance L increases.

Consequently, the characteristic impedance can be increased by forming more than one hole in the signal line.

In addition, the increase of the characteristic impedance as shown above makes it possible to suppress the reduction of the maximum input capacitance of the circuit connected at the end of the signal transmission line, and the increase of the characteristic impedance does not require an increase in the number of wiring layers.

The size of the hole 13 in the signal line shown in FIG. 1 can be determined as follows. The size of the hole is determined so as to reduce the wiring resistance as much as possible. At the same time, the size of the hole is determined so as to sufficiently increase the characteristic impedance between the signal line 11 and the ground plate 12 as much as possible.

The number of holes 13 in the signal line 11 may be determined so as to fulfill the following conditions. The number can be decreased to reduce the wiring resistance as much as possible, and the number can be increased to increase the characteristic impedance as much as possible.

It is noted that, instead of forming one signal line as shown in FIG. 1, the signal line may be formed by a plurality of signal line strips spaced apart from each other by slits and the plurality of signal line strips are connected at a certain portion such as both termination ends for forming a plurality of slit-like holes.

Second Embodiment

Figure 2:
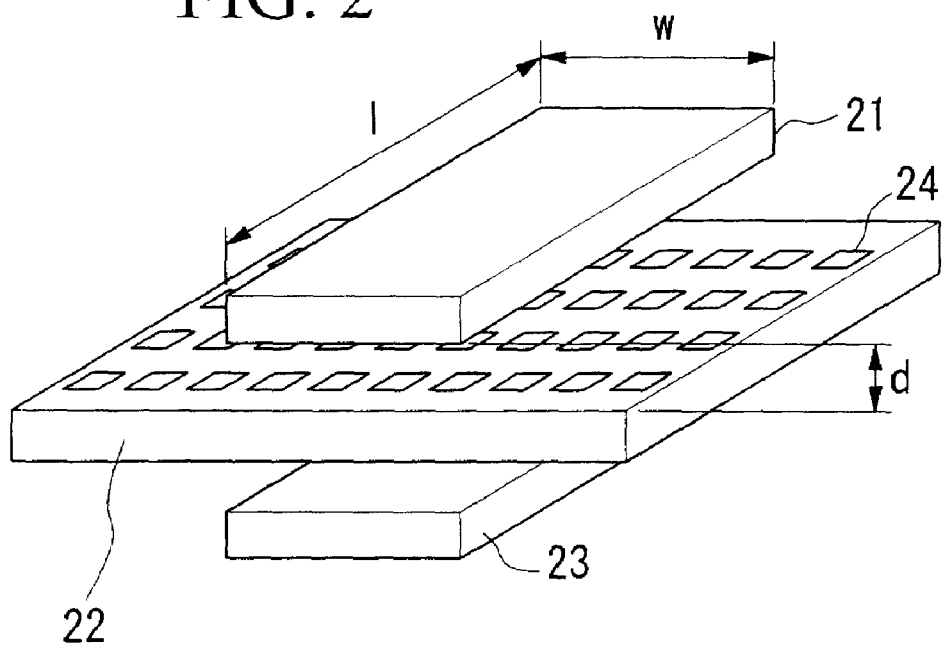
FIG. 2 is a diagram showing the structure of the signal transmission line according to the second embodiment of the present invention.

FIG. 2 is a diagram showing the structure of the signal transmission line according to the second embodiment of the present invention.

As shown in FIG. 2, in the signal transmission line of the microstrip structure realized in a semiconductor device according to the second embodiment, at least one hole 24 (normally, a plurality of holes 24) is formed on the ground plate 22 of a microstrip structure composed of a signal line 21 and a ground plate 22.

In the signal transmission line of the microstrip structure, the characteristic impedance Z is expressed by the equation, $$Z=(L/C)^{1/2}$$

where C represents the inter-wiring capacitance per unit length, and L represents the inductance of the wiring.

The provision of a hole (or a plurality of holes) in the ground plate 22 lengthen the electric force line generated between the signal line 11 and the ground plate 12 and the distance between the signal line 11 and the ground plate 12 is apparently elongated equivalently, which results in a decrease of the inter-wiring capacitance C.

When the velocity of an electro-magnetic wave is represented by v, the velocity v is constant and is expressed by the following equation.

$$v=1/(LC)^{1/2}$$

Thus, when the capacitance C decreases, the wiring inductance L increases.

Consequently, the characteristic impedance can be increased by forming more than one hole in the ground plate 22.

As described above, it becomes possible to suppress the reduction of the maximum input capacitance of the circuit connected at the end of the signal transmission line, and it is not necessary to increase the number of wiring layers.

The size of the hole 24 in the ground plate shown in FIG. 2 can be determined as follows. The size of the hole is determined to reduce the AC coupling between two signal lines 21 adjacent to each other above the hole 24 in the ground plate 22 as much as possible. At the same time, the size of the hole is determined to sufficiently increase the characteristic impedance between the signal line 11 and the ground plate 12 as much as possible.

The number of holes 24 in the ground plate shown in FIG. 2 can be determined so as to fulfill the following conditions. The number can be decreased to reduce the AC coupling between two signal lines 21 adjacent to each other above hole 24 in the ground plate 22 as much as possible, and the number of the holes is determined to increase the characteristic impedance between the signal line 21 and the ground plate 22 as much as possible.

Next, the magnitude of the coupling and the characteristic impedance are explained based on the results of simulations in the case of forming the ground plate 22 by a plurality of ground plates, separated by slit-like spaces, with reference to FIGS. 3 to 6.

Figure 3A:
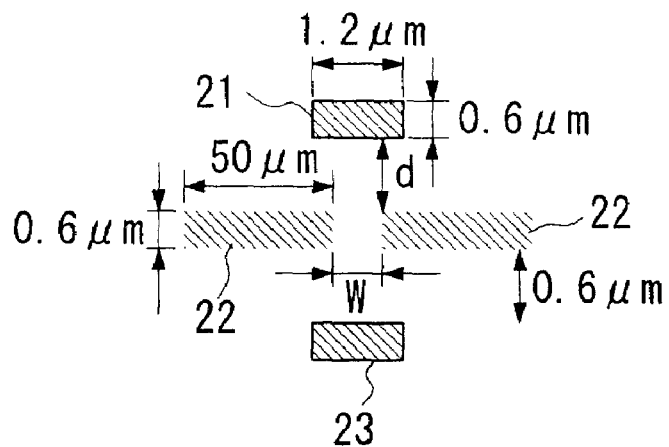
FIG. 3A and FIG. 3B are diagrams showing the relationship between signal lines and a ground plate provided with a single slit.
Figure 3B:
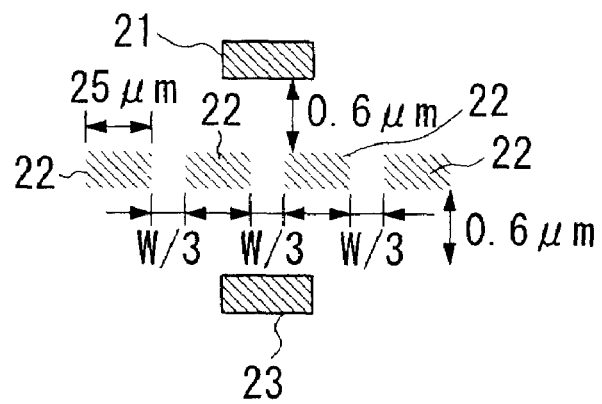

FIG. 3A is a cross-sectional view of one transmission line comprising one signal line 21 of 1.2 µm in width and 0.6 µm in thickness, and a ground plate, divided into two plates, each having a width of 50 µm, by a single slit of width w, wherein the ground plate is located spaced by a distance d from the signal line. FIG. 3B is a cross-sectional view of a transmission line comprising the signal line shown in FIG. 3A and a ground plate divided into four parts, having a width of 25 µm, by three slits, each having a width of w/3, and these four parts are separated by three slits each having a width of w, wherein the ground plate is separated from the signal line by a distance of 0.6 µm.

Figure 4:
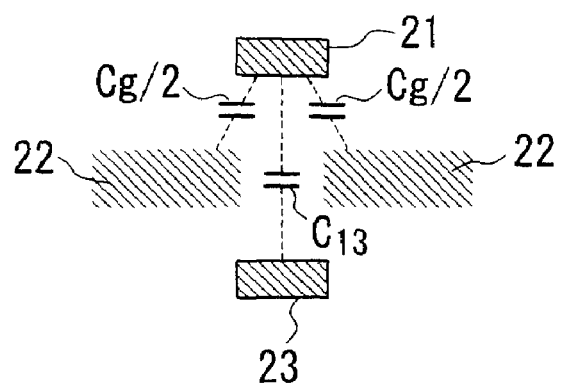
FIG. 4 is a diagram showing the relationship between signal lines and a ground plate provided with the slit divided into three slits.

FIG. 4 is a schematic diagram showing the capacitance between one signal line 21 and a ground plate 22 having a slit, and the other signal line 23. It is assumed that the capacitance between the signal line 21 and the ground plate 22 is represented by $C_g$, and the capacitance between the signal line 21 and the other signal line 23 is represented by C13.

Figure 5:
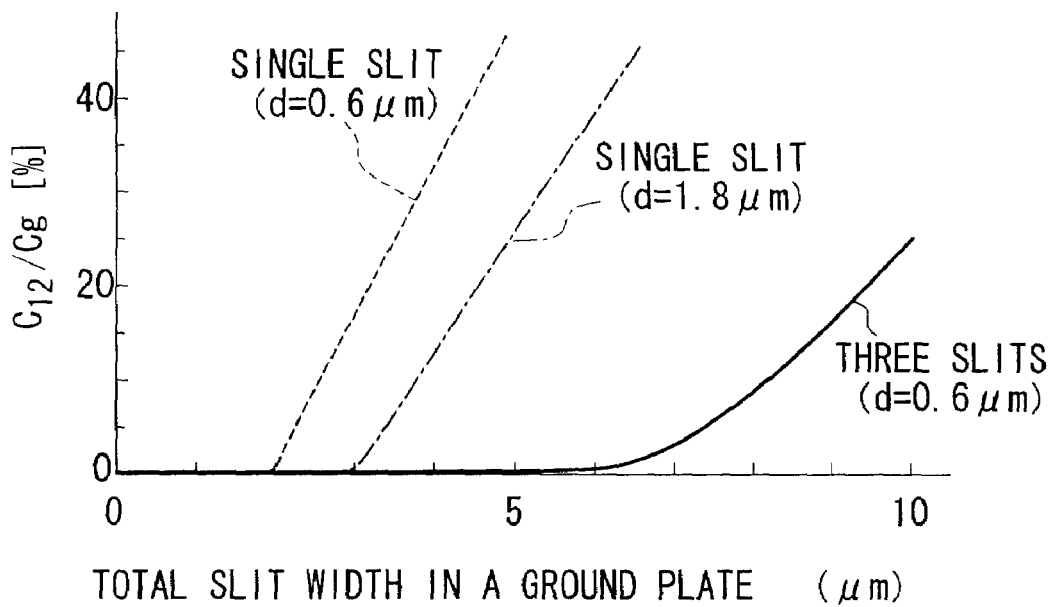
FIG. 5 is a graph showing the relationship between the slit width and magnitude of the coupling.
Figure 6:
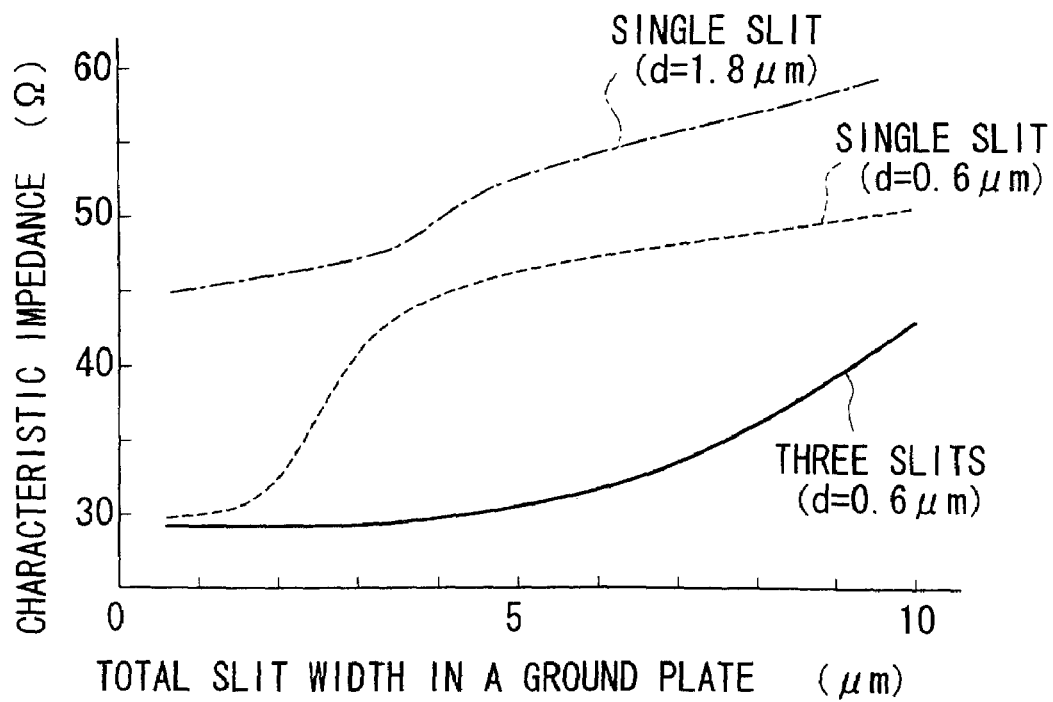
FIG. 6 is a graph showing the slit width in the ground plate and the characteristic impedance.

FIG. 5 is a diagram showing the relationship between the total slit width and a value of $C_{13}/C_g$, wherein three lines are shown, in which the dashed line shows the case that the ground plate is divided by a single slit and the distance between the ground plate and the signal line is 0.6 µm, the dashed and dotted line shows the case that the ground line is divided by a single slit and the distance between the ground plate and the signal line is 1.8 µm, and the solid line shows the case that the ground plate is divided into four parts and the distance between the ground plate and the signal line is 0.6 µm. It is noted that the value of $C_{13}/C_g$ represents the magnitude of the coupling between one signal line 21 with the other signal line 23.

In FIG. 5, when an allowable value of the coupling is assumed to be $C_{13}/C_g=0.2$, the total slit widths in the respective cases must be restricted to within 3 µ/m, 4.5 µm, and 9 µm or less, and the total slit width cannot exceed these values.

Third Embodiment

Figure 7:
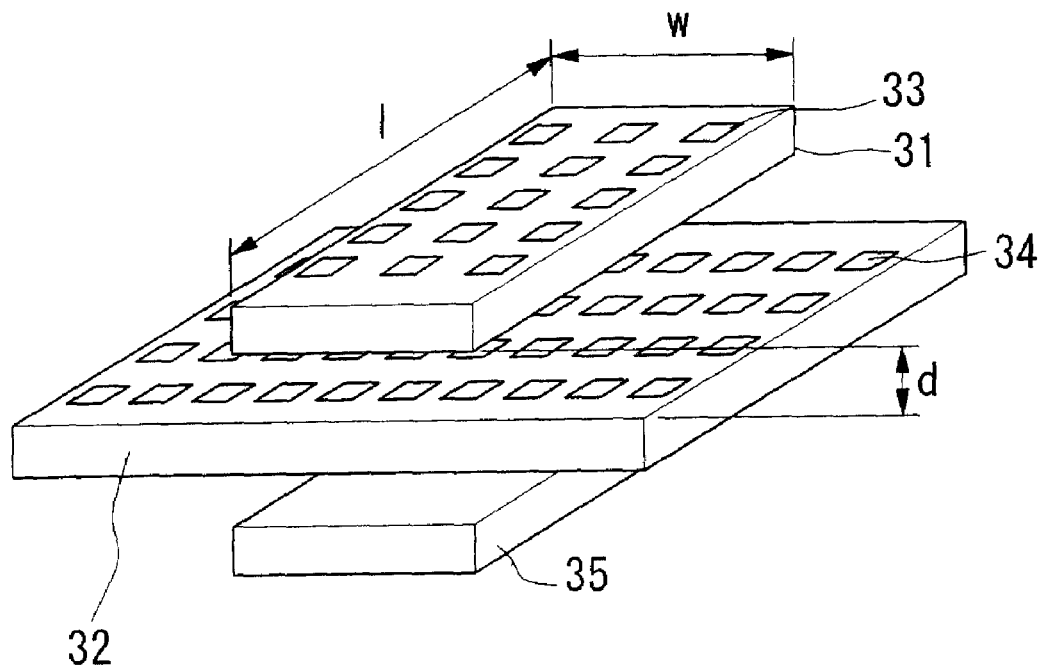
FIG. 7 is a diagram showing the structure of a signal transmission line according to the third embodiment of the present invention.
Figure 8:
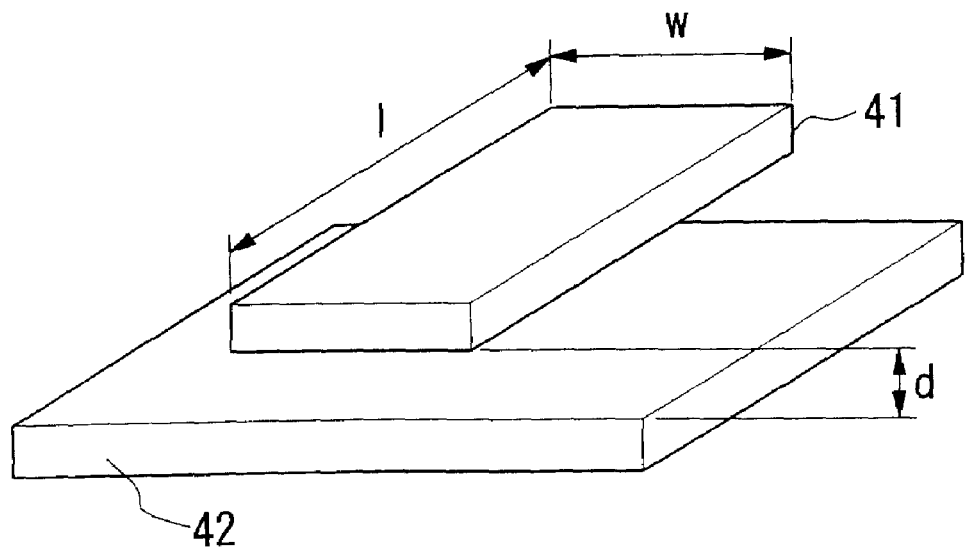
FIG. 8 is a diagram showing the structure of a conventional signal transmission line.

FIG. 7 is a diagram showing the structure of a semiconductor integrated circuit according to the third embodiment of the present invention.

As shown in FIG. 7, in the signal transmission line of the microstrip structure realized in a semiconductor device according to the present embodiment, at least one hole 33/34 (normally, a plurality of holes 33/34) is formed on the signal line 31 and the ground plate 32 of the microstrip structure composed of the signal line 31, the ground plate 32 and the other signal line 35.

In a signal transmission line of the microstrip structure, the characteristic impedance Z is expressed by the equation, $$Z=(L/C)^{1/2}$$

where, C represents the inter-wiring capacitance at an unit length, and L represents the inductance of the wiring.

The provision of a hole (or a plurality of holes) in both of the signal line 31 and the ground plate 32 lengthen the electric force line generated between the signal line 31 and the ground plate 32 and the distance between the signal line 31 and the ground plate 32 is apparently elongated equivalently, which results in a decrease of the inter-wiring capacitance C.

When the velocity of an electro-magnetic wave is represented by v, the velocity v is a constant and is expressed by the following equation. $v=1/(LC)^{1/2}$ Thus, when the capacitance C decreases, the wiring inductance L increases.

Consequently, it becomes possible to suppress the reduction of the maximum input capacitance of the circuit connected at the end of the signal transmission line, and it is not necessary to increase the number of wiring layers.

The size of the hole 33 in the ground plate 32 shown in FIG. 7 can be determined as follows. The size of the hole is determined to reduce the AC coupling between two adjacent signal lines 31 on the hole 33 in the ground plate 32 as much as possible, and the size of the hole is determined to increase the characteristic impedance between the signal line 21 and the ground plate 32 as much as possible.

The number of holes is determined so as to reduce the AC coupling between two signal lines 31 adjacent on the hole 33 in the ground plate 32 as much as possible, and so as to increase the characteristic impedance between the signal line 31 and the ground plate 32 as much as possible.

It is noted that it may be possible, instead of forming holes in the signal line and the ground plate, to constitute the signal transmission line by forming the signal line and the ground plate by a plurality of strips, and by connecting these strips at, for example, both termination ends of these strips so as to provide a plurality of slit-like holes between each of these strips.

The present invention was described above in detail by explaining the first to the third embodiments. However, the present invention is not limited to these three embodiments described above, but variants thereof can be envisaged without exceeding the scope of the present invention.

For example, the present invention includes the case of both of the signal line and the ground plate having holes together with slits.

Furthermore, in the above embodiments, one signal line is disposed on the ground plates. However, the ground plate may be disposed on the signal line, and the ground plate may occupy the most significant position. Such a disposition allows the ground plate to exhibit a shielding effect. In this case, the ground plate may be formed simultaneously with the formation of the bonding pads on the passivation film, which simplifies the manufacturing process.

As described above, in a signal transmission line of a microstrip structure composed of the signal line and the ground plate, the present invention shows a notable effect in that the capacitance between wiring can be decreased and the characteristic impedance between the signal line and the ground plate can be increased by forming holes in the signal line or in the ground plate.

The other effect of the present invention is that the coupling between one signal line with another signal line through the ground plate can be reduced by forming holes in the ground plate.

What is claimed:

1. A semiconductor integrated circuit comprising a microstrip structure comprising:
   a signal line;
   a ground plate; and another signal line disposed on an opposite side of the ground plate as said signal line;
wherein a plurality of through holes are formed in said signal line and an inner wall of said plurality of through holes is directly electrically connected to said signal line,
wherein, said plurality of through holes are formed along a longitudinal direction of said signal line and arranged at equal spaces or in a same pattern, and
wherein at least one through hole is formed in said ground plate and an aperture size of said through hole formed in said ground plate is smaller than a width of said signal line.

2. The semiconductor integrated circuit according to claim 1, wherein an aperture size of each of said plurality of through holes is smaller than a width of said signal line.

3. A semiconductor integrated circuit comprising a microstrip structure comprising:
a signal line;
a ground plate; and
another signal line disposed on an opposite side of said ground plate as said signal line;
wherein at least one through hole is formed in said signal line, and an inner wall of said through hole which is formed in said signal line is only directly electrically connected to said signal line,
wherein at least one through hole is formed in said ground plate, and an inner wall of said through hole which is formed in said ground plate is only directly electrically connected to said ground plate, and
wherein an aperture size of said through hole formed in said signal line and an aperture size of said through hole formed in said ground plate are smaller than a width of said signal line.

4. A semiconductor integrated circuit comprising a microstrip structure comprising:
a signal line;
a ground plate; and
another signal line disposed on an opposite side of said ground plate as said signal line;
wherein a plurality of through holes are formed in said signal line along a longitudinal direction of said ground plate, and inner walls of said through holes are only directly electrically connected to said signal line,
wherein an aperture size of each of said at least two through holes is smaller than a width of said signal line, and
wherein said plurality of through holes are arranged in a matrix having at least two rows and at least two columns.

5. A semiconductor integrated circuit comprising a microstrip structure comprising:
a signal line;
a ground plate; and
another signal line disposed on an opposite side of said ground plate as said signal line;
wherein at least one through hole is formed in said signal line, and an inner wall of said through hole is only directly electrically connected to said signal line,
wherein an aperture size of said through hole is smaller than a width of said signal line, and
wherein a width of said signal line, where said through hole is formed, is the same as a width of said signal line where said through hole is not formed.

6. A semiconductor integrated circuit comprising a microstrip structure comprising:
a signal line;
a ground plate; and
another signal line disposed on an opposite side of said ground plate as said signal line;
wherein a plurality of through holes are formed in said signal line along a direction orthogonal to a longitudinal direction of said ground plate, and inner walls of said through holes are only directly electrically connected to said signal line,
wherein an aperture size of each of said at least two through holes is smaller than a width of said signal lines, and
wherein at least one through hole is formed in said ground plate and an aperture size of said through hole formed in said ground plate is smaller than a width of said signal line.

* * * * *